(12) United States Patent
Lin et al.

(10) Patent No.: US 6,656,844 B1
(45) Date of Patent: Dec. 2, 2003

(54) METHOD OF FORMING A PROTECTED CROWN CAPACITOR STRUCTURE UTILIZING THE OUTSIDE CROWN SURFACE TO INCREASE CAPACITANCE

(75) Inventors: Chun-Chieh Lin, Taichung (TW); Wong-Cheng Shih, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 110 days.

(21) Appl. No.: 09/981,437

(22) Filed: Oct. 18, 2001

(51) Int. Cl.[7] .............................................. H01L 21/301
(52) U.S. Cl. ........................ 438/700; 438/396; 438/723
(58) Field of Search ................................. 438/253–256, 438/396–398, 700, 706, 723

(56) References Cited

U.S. PATENT DOCUMENTS

| | | | |
|---|---|---|---|
| 5,733,808 A | * 3/1998 | Tseng | 438/239 |
| 5,854,106 A | 12/1998 | Wu | 438/253 |
| 5,926,719 A | * 7/1999 | Sung | 438/396 |
| 6,054,347 A | 4/2000 | Lin | 438/253 |
| 6,077,738 A | * 6/2000 | Lee et al. | 438/241 |
| 6,100,137 A | * 8/2000 | Chen et al. | 438/253 |
| 6,168,989 B1 | 1/2001 | Chiang et al. | 438/253 |
| 6,187,624 B1 | 2/2001 | Huang | 438/253 |

* cited by examiner

Primary Examiner—Kin-Chan Chen
(74) Attorney, Agent, or Firm—George O. Saile; Stephen B. Ackerman

(57) ABSTRACT

A method of forming a DRAM capacitor structure featuring increased surface area, has been developed. The method features a polysilicon top plate structure located overlying an array comprised of individual polysilicon storage node structures. Each polysilicon storage node structure is comprised with tall, vertical features, and additional surface area is obtained via removal of butted insulator layer from a first group of surfaces of the storage node structures. Insulator layer remains butted to a second group of storage node structure surfaces to prevent collapse of the tall, vertical features of the storage node structures during subsequent processing sequences.

Figure 1A:
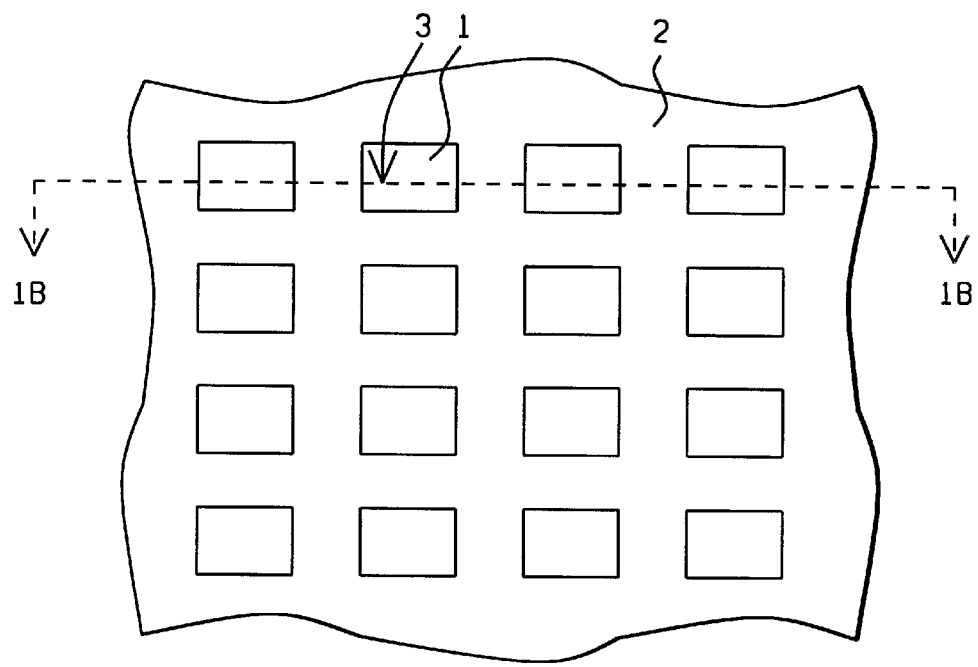
Figure 1B:
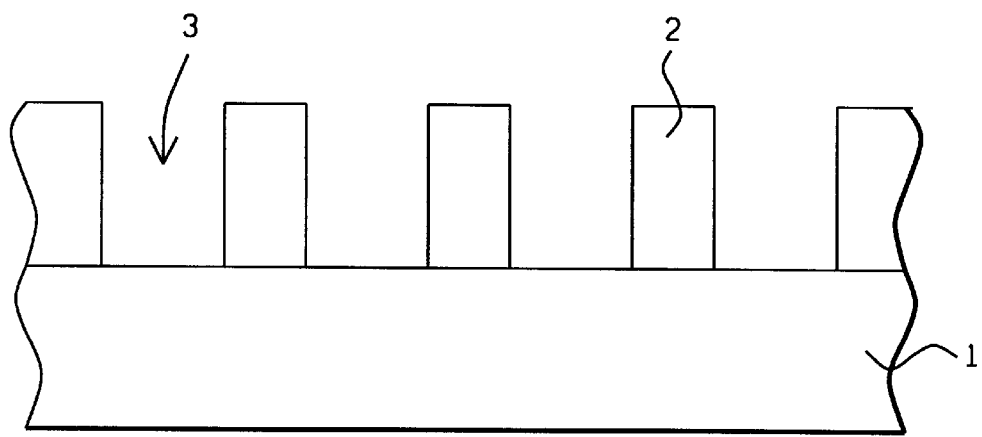

23 Claims, 5 Drawing Sheets under a top plate structure. The method described in this invention features an iteration in which a matrix of storage node structures is formed in a capacitor opening via patterning using a photoresist shape formed in a positive photoresist layer, resulting in storage node structures comprised with tall vertical features, in which each tall vertical feature is comprised with a surface butting an adjacent insulator, and with a surface left bare, or not covered by insulator. Although this invention is described for a DRAM device, in which a transfer gate transistor is an N channel device, this invention can also be applied to DRAM devices in which the transfer gate transistor is a P channel device. In addition this invention can also be applied to either logic or to embedded DRAM devices, in which the storage capacitor structure is an integral part of the logic chip. Semiconductor substrate 1, comprised of P type, single crystalline silicon, with a <100> crystallographic orientation, is used and schematically shown in FIG. 1B. Metal oxide semiconductor field effect transistor (MOSFET), devices 20, are next formed, and schematically shown in FIG. 1B. The MOSFET components, not shown in the drawings, are formed via conventional procedures, featuring the formation of a gate insulator layer on semiconductor substrate 1, comprised of a silicon dioxide layer thermally grown to a thickness between about 30 to 200 Angstroms. A conductive gate structure, comprised of a doped polysilicon layer, which in turn can be comprised of an overlying metal silicide layer such as tungsten silicide, is next formed on the underlying gate insulator layer, via deposition of the polysilicon and metal silicide components, followed by a patterning procedure, accomplished using conventional photolithographic and reactive ion etching (RIE), procedures. Lightly doped source/drain regions are then formed in areas of semiconductor substrate 1 not covered by the conductive gate structure, via ion implantation of an N type species such as arsenic or phosphorous. Insulator spacers on the sides of the conductive gate structures are next formed via deposition of an insulator layer such as silicon nitride or silicon oxide, followed by an anisotropic RIE procedure. Heavily doped source/drain regions 2, shown schematically in FIG. 1B, are next formed in regions of semiconductor substrate 1, not covered by the conductive gate structure, or by the insulator spacers, again via implantation of an N type species such as arsenic or phosphorous.

First insulator layer 3, comprised of either silicon oxide, borophosphosilicate glass (BPSG), or phosphosilicate glass, is next deposited via low pressure chemical vapor deposition (LPCVD), or via plasma enhanced chemical vapor deposition (PECVD), procedures, to a thickness between about 2000 to 20000 Angstroms. Chemical mechanical polishing procedures are used if needed for planarization purposes. Conventional photolithographic and RIE procedures, using CHF$_3$ as an etchant for first insulator layer 3, are used to open storage node contact holes 4, in first insulator layer 3, exposing the top surface of heavily doped source/drain regions 2. After removal of the photoresist shape used as an etch mask for definition of storage node contact holes 4, an N type, in situ doped polysilicon layer is deposited via LPCVD procedures to a thickness between about 200 to 5000 Angstroms, completely filling storage node contact holes 4. Removal of the portions of the polysilicon layer from the top surface of first insulator layer 3, is accomplished via a chemical mechanical polishing procedure, or via a selective RIE procedure using Cl$_2$ or SF$_6$ as a selective etchant for polysilicon. This results in polysilicon plug structures 5, in storage node contact holes 4. The result of the above procedures is schematically shown in FIG. 1B. FIG. 1A, schematically shows a top view of polysilicon plug structures 5, in first insulator layer 3. The cross-sectional view shown in FIG. 1B, is obtained from view 1B—1B', of FIG. 1A.

Second insulator layer 6, again comprised of either silicon oxide, BPSG, or PSG, is next deposited via LPCVD or PECVD procedures to a thickness between about 2000 to 30000 Angstroms. Conventional photolithographic and RIE procedures, again using CHF$_3$ as an etchant for second insulator layer 6, are used to define capacitor opening 7, in second insulator layer 6, with capacitor opening 7, exposing the top surface of polysilicon plug structure 5, as well as exposing the top surface of first insulator layer 3, not covered by polysilicon plug structure 5. Capacitor opening 7 is formed with a diameter between about 500 to 30000 Angstroms. After removal of the photoresist shape used for definition of capacitor opening 7, a conductive layer 8a, such as a polysilicon layer, is deposited via LPCVD procedures to a thickness between about 100 to 1000 Angstroms. Polysilicon layer 8a, can be doped in situ during deposition via the addition of arsine or phosphine to a silane or disilane ambient, or polysilicon layer 8a, can be deposited intrinsically, then doped via implantation of arsenic or phosphorous ions. If desired polysilicon layer 8a, can be replaced by a metal layer such as tungsten, titanium nitride or tantalum nitride, obtained via plasma vapor deposition (PVD), procedures, at the same thickness used for the polysilicon option. A third insulator layer 9a, such as silicon oxide, is next deposited via LPCVD or via PECVD procedures to a thickness between about 100 to 1000 Angstroms, completely filling the space in capacitor opening 7, not occupied by conductive layer 8a. The result of these procedures is schematically shown in FIG. 2.

Figure 3:
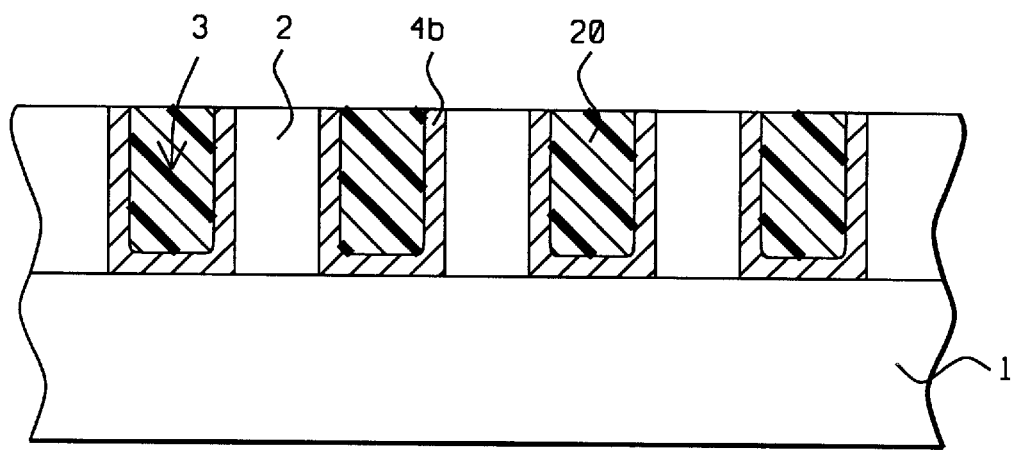

A critical photoresist shape 10, is next formed on the top surface of third insulator layer 9a. Photoresist shape 10, is comprised of either a positive photoresist material, formed at a thickness between about 1000 to 20000 Angstroms. Photoresist shape 10, is used as an etch mask to allow an anisotropic RIE procedure, using CHF$_3$ as an etchant for third insulator layer 9a, and using Cl$_2$ or SF$_6$ as an etchant for conductive layer 8a, to be employed, to define a storage node structure, comprised of conductive layer shape 8b, and overlying, third insulator shape 9b, located in capacitor opening 7. This is schematically shown in FIG. 3. Removal of photoresist shape 10, is next accomplished via plasma oxygen ashing and careful wet cleans. The wet clean cycle features a buffered hydrofluoric not butted by insulator, will now be described in detail. Semiconductor substrate 1, comprised of P type, single crystalline silicon, with a <100> crystallographic orientation is used and schematically shown in FIG. 1B. The transfer gate transistor used with the capacitor structure described in this invention, will not be described. The transfer gate transistor will be comprised of a conducive gate, or word line structure, on an underlying gate insulator layer, with source/drain regions formed in regions of semiconductor substrate 1, not covered by the gate or word line structure. Insulator layer 2, comprised of either silicon oxide, or boro-phosphosilicate glass (BPSG), is deposited via low pressure chemical vapor deposition (LPCVD), or plasma enhanced chemical vapor deposition (PECVD), procedures, at a thickness between about 5000 to 20000 Angstroms. If desired insulator layer 2, can be subjected to a chemical mechanical polishing procedure to planarize the top surface of insulator layer 2. A photoresist shape, not shown in the drawings, is used as an etch mask to allowing an anisotropic, reactive ion etching (RIE), procedure to define capacitor openings 3, in insulator 2. The RIE procedure is performed using $CHF_3$ as an etchant for insulator layer 2. The result of these procedures are schematically shown, in cross-sectional style, in FIG. 1B. The portion of semiconductor substrate 1, exposed at the bottom of capacitor openings 3, is comprised with source/drain regions. A top view of the array of capacitor openings 3, is schematically shown in FIG. 1A.

Figure 2:
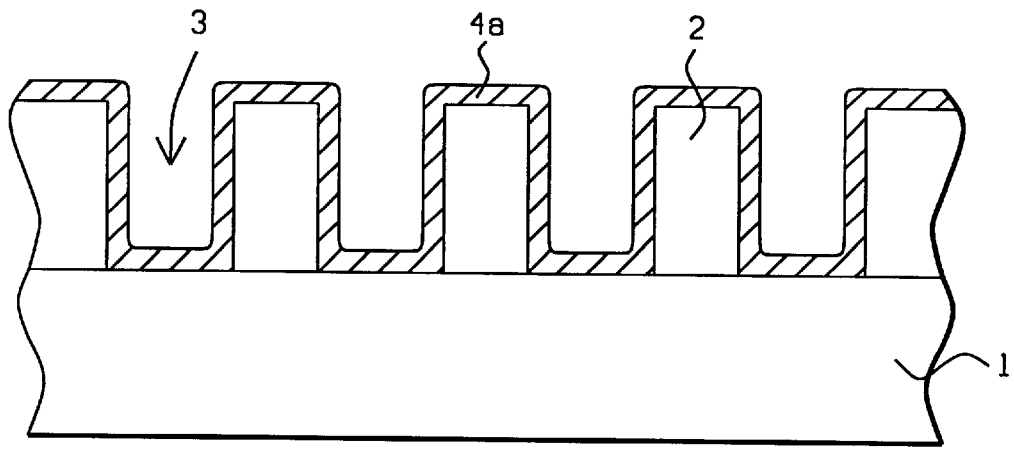

Formation of storage node structures is next addressed and schematically described, in cross-sectional style, using FIGS. 2–3. Polysilicon layer 4a, is deposited via LPCVD procedures, at a thickness between about 750 to 1250 Angstroms, coating all surfaces of capacitor openings 3, as well as coating the exposed source/drain regions located at the bottom of capacitor openings 3. Polysilicon layer 4a, is doped in situ, during deposition via the addition of arsine, or phosphine, to a silane ambient. If desired a hemispherical grain (HSG), silicon layer can be formed on polysilicon layer 4a, to increase the surface area of te subsequent storage node structures. A photoresist layer is applied then etched, or polished back to expose the top surface of polysilicon layer 4a, in a region in which polysilicon layer 4a, overlays the top surface of insulator layer 2, while photoresist plugs 20, are formed and still remain in capacitor openings 3. Another chemical mechanical polishing procedure is then employed to selectively remove exposed portions of polysilicon layer 4a, from the top surface of insulator layer 2, resulting in storage node structures 4b, located in capacitor openings 3. The vertical features of storage node structures 4b, are between about 5000 to 20000 Angsroms in height, equal to the thickness of insulator layer 2. If desired removal of exposed portions of polysilicon layer 4a, can also be accomplished via a selective RIE procedure, using $Cl_2$ or $SF_6$ as an etchant for polysilicon. Photoresist plugs 20, protects the portions of polysilicon layer 4a, in the capacitor openings, during the selective RIE procedure. Removal of photoresist plugs 20, is then accomplished via plasma oxygen ashing procedures.

Figure 4A:
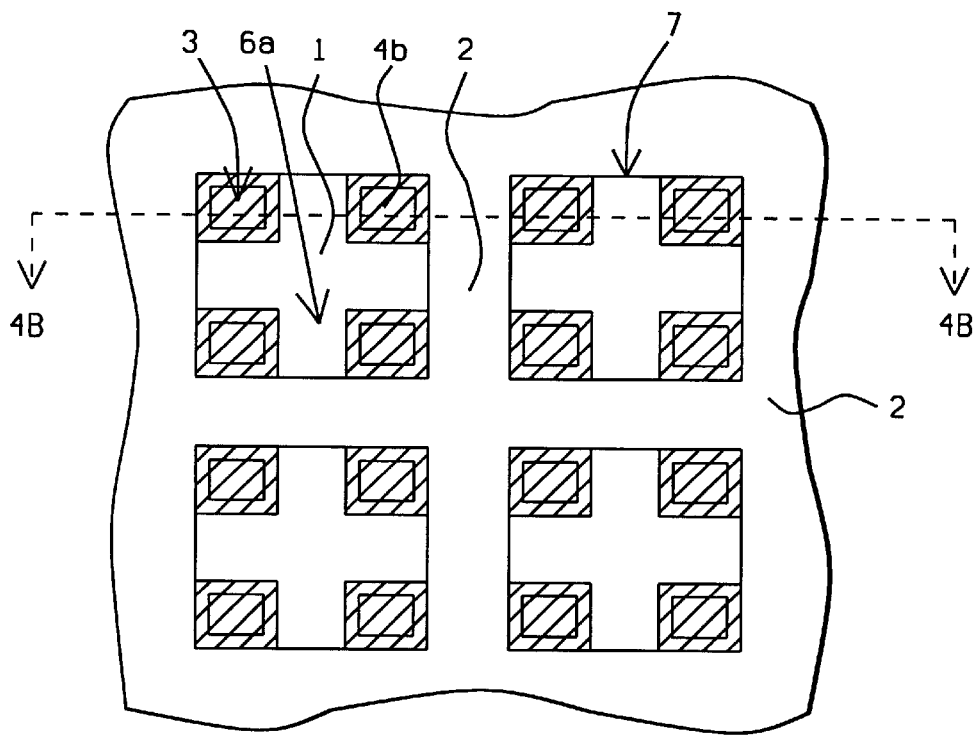
Figure 4B:
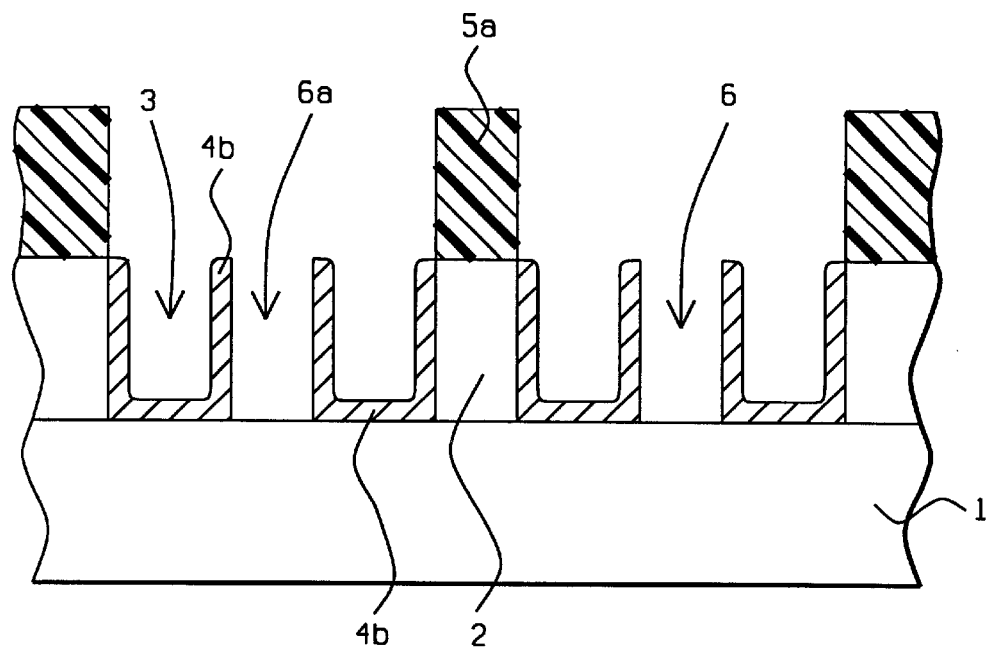

The definition of a matrix, or of an array of storage node structures, and the removal of insulator layer 2, from specific outside surfaces of the tall, vertical features of the storage node structures, are next addressed, in a first iteration of this invention. A positive photoresist layer is applied followed by exposure of regions of the positive photoresist layer through openings in a specific photolithographic plate. After development of the exposed portions of the positive photoresist layer, photoresist shape 5a, shown schematically in FIG. 4B, is defined. Photoresist shape 5a, is then used as an etch mask, allowing regions of insulator layer 2, not covered by photoresist shape 5a, to be selectively removed, resulting in opened area 6a, now exposing portions of semiconductor substrate 1. The selective removal of exposed regions of insulator layer 2, is accomplished via a RIE procedure using $CHF_3$ as an etchant for insulator layer 2, or via a wet etch procedure, using a buffered hydrofluoric acid solution. The etch procedure allows the outside surface of some of the tall, vertical features of storage node structures 4b, to be bare, and therefore to contribute to the surface area of a subsequent capacitor structure. This is shown schematically, in cross-sectional style in FIG. 4B. A clearer picture of the regions of removed. insulator layer is schematically shown in a top view of FIG. 4A. It can be seen that for matrix 7, comprised of four storage node structures 4b, insulator layer 2, had been removed from the outside surfaces of storage node structures 4b, located only inside matrix 7, while the outside surfaces of these same storage node structures, not located in matrix 7, are still butting insulator layer 2. This combination allows additional capacitor surface area, regarding the bare surfaces of the tall, vertical features, while still providing protection against collapse of via the features still butting against insulator layer 2. Photoresist shape 5a, is removed via plasma oxygen ashing procedures.

Figure 5:
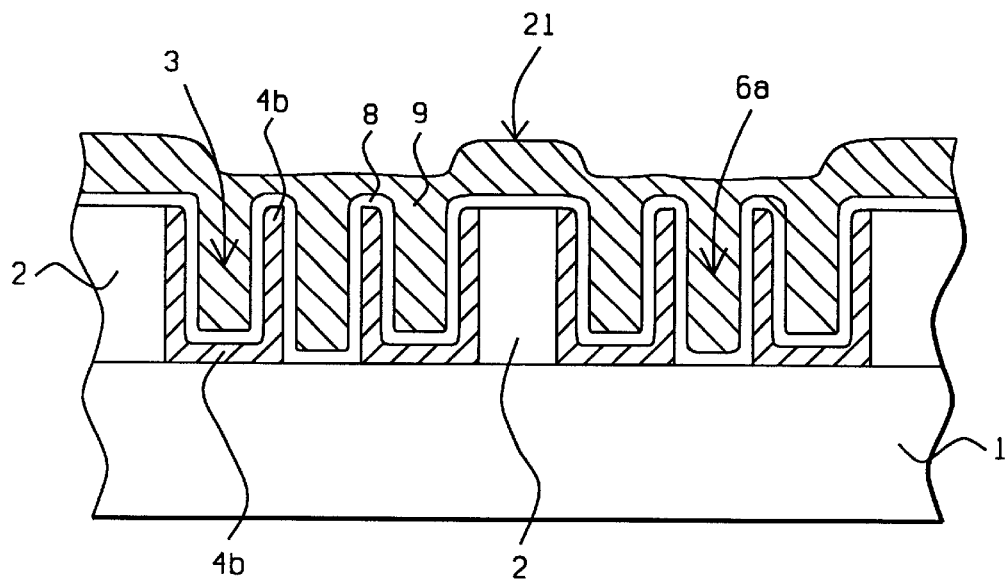

The completion of the capacitor structure, featuring a matrix or array of storage node structures, is next addressed and schematically shown, in cross-sectional style, in FIG. 5. Capacitor dielectric layer 8, is deposited, overlying all exposed surfaces of storage node structures 4b. Capacitor dielectric layer 8, can be a tantalum oxide, silicon oxide, silicon oxynitride, or silicon nitride layer, deposited via plasma vapor deposition (PVD), or via chemical vapor deposition (CVD), procedures, at a thickness between about 40 to 60 Angstroms. A polysilicon layer is next deposited via LPCVD procedures, to a thickness between about 750 to 1250 Angstroms, with the polysilicon layer doped in situ, during deposition, via the addition of arsine, or phosphine to a silane ambient. Photolithographic and RIE procedures, using $Cl_2$ or $SF_6$ as an etchant, are used to define polysilicon top plate structure 9, completely overlying the array of storage node structures. Capacitor structure 21, comprised of top plate structure 9, dielectric layer 8, and storage node structures 4b, offers increased surface area as a result of uncovered tall, vertical features for some of the outside surfaces, while offering protection against collapse of the storage node structures as a result of some of the outside surfaces of the storage node structure still butting adjacent insulator layer 2.

Figure 6A:
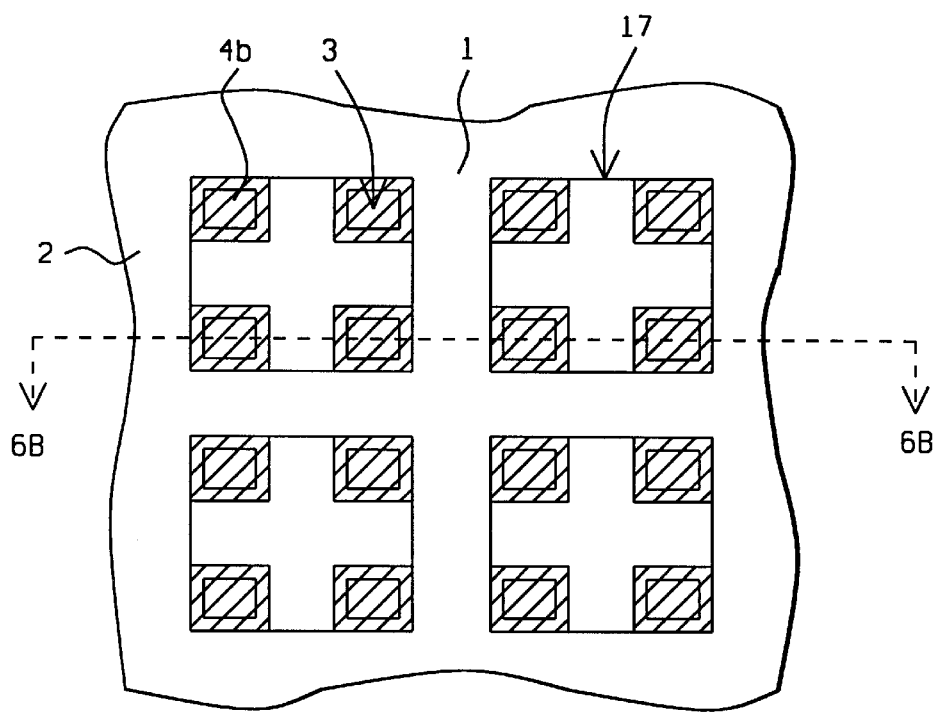
Figure 6B:
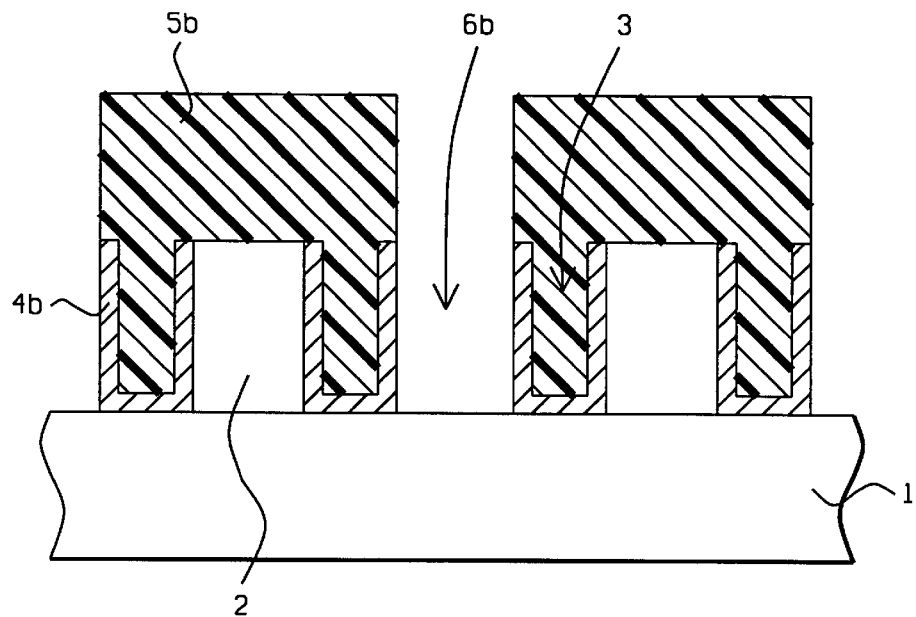

A second iteration of this invention is next described, featuring a photoresist shape, obtained from exposure and development of a negative photoresist layer, used as a mask to define a storage node matrix. A negative photoresist layer is applied and exposed through clear regions in the same photolithographic plate previously used in the first iteration of this invention. Development procedures now remove only unexposed regions of the negative photoresist layer, thus resulting in the definition of photoresist shape 5b, shown schematically, in cross-sectional style in FIG. 6B. Photoresist shape 5b, is then used as an etch mask allowing exposed regions of insulator layer 2, to be removed, resulting in outside surfaces of the storage node structures, residing outside of matrix 17, to be now be bare. Removal of exposed regions of insulator layer 2, is again accomplished via a selective dry etching procedure using $CHF_3$ as an etchant, or via a wet etch procedure using a buffered hydrofluoric acid solution as an etchant. This is shown schematically as a top view in FIG. 6A. This is in contrast to previously described matrix 7, defined via an etch mask formed via exposure of a positive photoresist layer, where only the outside surfaces of storage node structures located inside the storage node matrix had insulator layer removed. For this iteration the desired, additional surface area is realized from the uncovered surfaces of storage node structures residing outside matrix 17, while protection against collapse of the storage node structures is preventing by insulator layer 2, still butting the surfaces of the storage node structures, inside matrix 17. Photoresist shape 5b, is removed via plasma oxygen ashing procedures.

Figure 7:
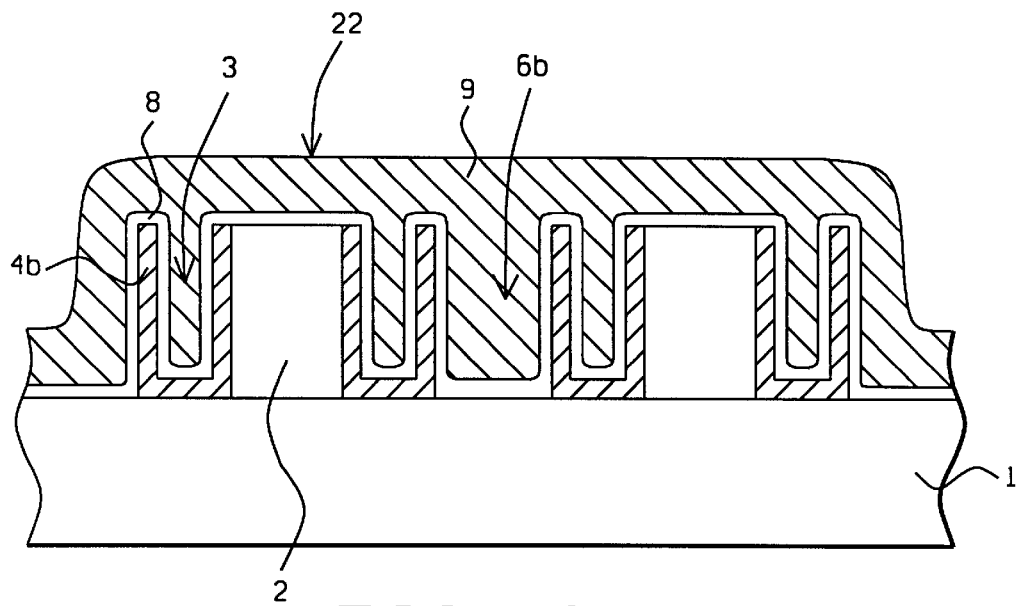

The completion of the capacitor structure featuring matrix 17, comprised of an array of storage node structures, is next addressed and schematically shown, in cross-sectional style, in FIG. 7. Capacitor dielectric layer 8, again as previously described in the first iteration, comprised of either tantalum oxide, silicon oxide, silicon oxynitride, or silicon nitride, at a thickness between about 40 to 60 Angstroms, is again used to overlay storage node structures 4b. Top plate structure 9, again comprised of an in situ doped polysilicon layer, is again defined via photolithographic and RLE procedures, using $Cl_2$ or $SF_6$, as an etchant, resulting in the formation of capacitor structure 22, comprised with a matrix of storage node structures, with each storage node structure comprised with tall, vertical features, and with the outside surfaces of the storage node structures located inside matrix 17, butting insulator layer, while leaving the outside surfaces of the storage node structures located outside matrix 17, bare.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a capacitor structure on a semiconductor substrate, comprising the steps of:
   providing a transfer gate transistor comprised of a gate structure on an underlying gate insulator layer, with source/drain regions located in regions of said semiconductor substrate not covered by said gate structure;
   forming capacitor openings in an insulator layer with each capacitor opening exposing a portion of a top surface of a source/drain region;
   forming storage node structures in said capacitor openings, with each storage node structure comprised with tall, vertical features;
   using an overlying photoresist shape as an etch mask to selectively remove exposed portions of said insulator layer from a first group of surfaces of a storage node structure array, while leaving portions of insulator layer located underlying said photoresist shape, still butting a second group of surfaces of said storage node structure array;
   forming a capacitor dielectric layer on said storage node structure array; and
   forming a top plate structure on said capacitor dielectric layer, resulting in said capacitor structure comprised of overlying, said top plate structure, said capacitor dielectric layer, and underlying, said storage node structure array.

2. The method of claim 1, wherein said insulator layer is a silicon oxide, or boro-phosphosilicate glass (BPSG), layer, obtained via LPCVD or PECVD procedures, at a thickness between about 5000 to 20000 Angstroms.

3. The method of claim 1, wherein said capacitor openings are defined in said insulator layer via an anisotropic RIE procedure using $CHF_3$ as an etchant.

4. The method of claim 1, wherein said storage node structures are comprised of polysilicon, obtained from deposition of a polysilicon layer via LPCVD procedures at a thickness between about 750 to 1250 Angstroms, doped in situ, during deposition, via the addition of arsine, or phosphine to a silane ambient, then defined via use of a chemical mechanical polishing procedure.

5. The method of claim 1, wherein the height of said tall, vertical features of said storage node structures is between about 5000 to 20000 Angstroms.

6. The method of claim 1, wherein said photoresist shape, used as an mask to remove exposed portions of said insulator layer, is formed from a positive photoresist layer.

7. The method of claim 1, wherein said photoresist shape, used as an mask to remove exposed portions of said insulator layer, is formed from a negative photoresist layer.

8. The method of claim 1, wherein said first group of surfaces of said storage node structure array, subjected to insulator removal using a photoresist shape formed from a positive photoresist layer as an etch mask, are the outside surfaces of each storage node structure located inside said storage node structure array, while said second group of surfaces of said storage node structure array, protected by the photoresist shape formed from the positive photoresist layer during the insulator removal procedure, are the outside surfaces of each storage node structure located outside said storage node structure array.

9. The method of claim 1, wherein said second group of surfaces of said storage node structure array, protected from insulator removal procedure by a photoresist shape formed from a negative photoresist layer, are the outside surfaces of each storage node structure located inside said storage node structure array, while said first group of surfaces of said storage node structures, subjected to the insulator removal procedure, not protected by the photoresist shape formed from the negative photoresist layer, are the outside surfaces of each storage node structure located outside said storage node structure array.

10. The method of claim 1, wherein said capacitor dielectric layer is selected from the group consisting of: tantalum oxide, silicon oxide, silicon oxynitride, and silicon nitride, all obtained at a thickness between about 40 to 60 Angstroms.

11. The method of claim 1, wherein said top plate structure is a polysilicon top plate structure, defined via photolithographic and dry etch procedures applied to a polysilicon layer which in turn is obtained via LPCVD procedures at a thickness between about 750 to 1250 Angstroms, and doped in situ, during deposition, via the addition of arsine, or phosphine to a silane ambient.

12. A method of fabricating a capacitor structure on a semiconductor substrate, featuring a polysilicon storage node structure array, with each storage node structure comprised with tall, vertical features, and with a first group of surfaces of said polysilicon storage node structure array butting an adjacent insulator layer, while a second group of surfaces of said polysilicon storage node structure array is not butted by said insulator layer, comprising the steps of:
   providing a transfer gate transistor comprised of a gate structure on an underlying gate insulator layer, with source/drain regions located in regions of said semiconductor substrate not covered by said gate structure;
   forming capacitor openings in an insulator layer with each capacitor opening exposing a portion of a top surface of a source/drain region;
   forming said polysilicon storage node structure array comprised of four individual polysilicon storage node structures, each in a capacitor opening, and with each said polysilicon storage node structure comprised with tall, vertical features, and comprised with a bottom polysilicon feature located on an underlying portion of a source/drain region;

forming a photoresist shape with openings exposing portions of said insulator layer;

performing a selective etch procedure to remove said portions of said insulator layer exposed in said openings in said photoresist shape, resulting in said second group of surfaces of said polysilicon storage node structure array;

forming a capacitor dielectric layer on said second group of polysilicon storage node structures; and forming a polysilicon top plate structure on said capacitor dielectric layer, overlying said polysilicon storage node structure array.

13. The method of claim 12, wherein said insulator layer is a silicon oxide, or boro-phosphosilicate glass (BPSG), layer, obtained via LPCVD or PECVD procedures. at a thickness between about 5000 to 20000 Angstroms.

14. The method of claim 12, wherein said capacitor openings are defined in said insulator layer via an anisotropic RIE procedure using $CHF_3$ as an etchant.

15. The method of claim 12, wherein each polysilicon storage node structure, of said polysilicon storage node structure array, is formed from a polysilicon layer obtained via LPCVD procedures at a thickness between about 750 to 1250 Angstroms, and doped in situ, during deposition, via the addition of arsine, or phosphine to a silane ambient.

16. The method of claim 12, wherein the height of said tall, vertical features of said polysilicon storage node structures is between about 750 to 1250 Angstroms.

17. The method of claim 12, wherein said photoresist shape, used as an mask to remove portions of said insulator layer, is formed from a positive photoresist layer.

18. The method of claim 12, wherein said photoresist shape, used as an mask to remove portions of said insulator layer, is formed from a negative photoresist layer.

19. The method of claim 12, wherein said selective etch procedure used to remove portions of said insulator exposed in said openings in said photoresist shape, is performed using a RIE procedure, using $CHF_3$ as an etchant, or performed using a wet etch procedure, using a buffered hydrofluoric acid solution as an etchant.

20. The method of claim 12, wherein said bare surfaces of said second group of surfaces of said polysilicon storage node structure arrays, resulting from exposure to said selective etch procedure using a photoresist shape formed from a positive photoresist layer as an etch mask, are the outside surfaces of each polysilicon storage node structure located inside said polysilicon storage node structure array.

21. The method of claim 12, wherein bare surfaces of said second group of surfaces of said polysilicon storage node structure array, resulting from exposure to said selective etch procedure using a photoresist shape formed from a negative photoresist layer as an etch mask, are the outside surfaces of each polysilicon storage node structure located outside said polysilicon storage node structure array.

22. The method of claim 12, wherein said capacitor dielectric layer is selected from the group consisting of: tantalum oxide, silicon oxide, silicon oxynitride, and silicon nitride, all obtained at a thickness between about 40 to 60 Angstroms.

23. The method of claim 12, wherein said polysilicon top plate structure is defined via photolithographic and dry etch procedures applied to a polysilicon layer which in turn is obtained via LPCVD procedures at a thickness between about 750 to 1250 Angstroms, and doped in situ, during deposition, via the addition of arsine, or phosphine to a silane ambient.

* * * * *